United States Patent
Burlak et al.

(10) Patent No.: US 7,671,571 B2
(45) Date of Patent: Mar. 2, 2010

(54) SEMICONDUCTOR DEVICE HAVING AN INTEGRATED, SELF-REGULATED PWM CURRENT AND POWER LIMITER AND METHOD

(75) Inventors: Gary J. Burlak, Lake Orion, MI (US); Marian Mirowski, West Bloomfield, MI (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 12/070,710

(22) Filed: Feb. 20, 2008

(65) Prior Publication Data

US 2008/0284404 A1     Nov. 20, 2008

Related U.S. Application Data

(63) Continuation of application No. 11/172,515, filed on Jun. 30, 2005, now abandoned.

(51) Int. Cl.
*G05F 1/575* (2006.01)

(52) U.S. Cl. .................. 323/275; 323/280; 361/91.1

(58) Field of Classification Search ............. 307/38–41; 361/23–33, 91.1; 290/448–450, 464, 490, 290/497, 501–506; 320/128, 150; 323/272–276, 323/280, 907, 908
See application file for complete search history.

(56) References Cited

U.S. PATENT DOCUMENTS

| | | | |
|---|---|---|---|
| 4,845,419 A * | 7/1989 | Hacker | 320/136 |
| 5,293,077 A | 3/1994 | Seki et al. | |
| 6,118,254 A * | 9/2000 | Faulk | 320/141 |
| 6,144,187 A | 11/2000 | Bryson | |
| 6,972,969 B1 | 12/2005 | Shteynberg et al. | |
| 7,035,064 B2 * | 4/2006 | Schimanek et al. | 361/23 |

FOREIGN PATENT DOCUMENTS

EP     1 357 461 A2     10/2003

OTHER PUBLICATIONS

Office Action dated Jul. 2, 2007 as cited in U.S. Appl. No. 11/172,515.
Maxim, "Accurate DC-DC Converter Minimizes Wasted Power," May 11, 2003, 4 pages.
Maxim, "3.6A, 1.4 MHz, Low-Voltage, Internal-Switch Step-Down Regulator with Dynamic Output Voltage Control," 19-2729, Rev. 1, Aug. 2005, pp. 1-19.
Maxim, "MAX1536 Evaluation Kit," 19-2871; Rev. 0; May 2003, pp. 1-6.

(Continued)

*Primary Examiner*—Rajnikant B Patel
(74) *Attorney, Agent, or Firm*—Lisa K. Jorgenson; William A. Munck (57) ABSTRACT

A method includes receiving an activation signal at a semiconductor device and generating an output power signal at the semiconductor device in response to receiving the activation signal. The output power signal has a duty cycle. The method also includes providing the output power signal to a load. The output power signal provides power to the load. An amount of power provided to the load is based on the duty cycle of the output power signal. In addition, the method includes adjusting the duty cycle of the output power signal using at least one of a current limiter and a power limiter integrated in the semiconductor device.

20 Claims, 4 Drawing Sheets

OTHER PUBLICATIONS

Maxim, "2A, Low-Voltage, Step-Down Regulator with Synchronous Rectification and Internal Switches," 19-1457; Rev 3; Aug. 2005, pp. 1-11.

Texas Instruments, "Constant Current LED Driver," Dec. 2002 (Revised Jan. 2003), 23 pages.

Texas Instruments, "TPS62000-Q1, TPS62001-Q1, TPS62002-Q1, TPS62003-Q1, TPS62004-Q1, TPS62005-Q1, TPS62006-Q1, TPS62007-Q1, TPS62008-Q1, High Efficiency Step-Down Low Power DC-DC Converter," Apr. 2004, 22 pages.

Texas Instruments, "Power and Battery Management IC for Li-ION Powered Systems," Jun. 2003 (Revised Jan. 2005), pp. 55 pages.

Texas Instruments, "Power Management IC for Li-ION Powered Systems," Sep. 2005 (Revised Jul. 2007), 48 pages.

Texas Instruments, "Triple Output LCD Supply with Linear Regulator and Power Good," Nov. 2004, 23 pages.

European Search Report dated Oct. 1, 2009 in connection with European Patent Application No. EP 06 25 3188.

* cited by examiner

SEMICONDUCTOR DEVICE HAVING AN INTEGRATED, SELF-REGULATED PWM CURRENT AND POWER LIMITER AND METHOD

CROSS REFERENCE TO RELATED APPLICATION

This application is a continuation of prior application Ser. No. 11/172,515 filed on Jun. 30, 2005 now abandoned and which is incorporated herein by reference.

TECHNICAL FIELD

This disclosure is generally directed to power management systems and more specifically to a semiconductor device having an integrated, self-regulated pulse width modulation ("PWM") current and power limiter and method.

BACKGROUND

Pulse width modulation ("PWM") is a technique routinely used to control the delivery of power to components in a system. For example, pulse width modulation may be used to control the delivery of power to lamps, motors, and solenoids in a vehicle. Using this technique, the duty cycle of a signal that supplies power to a component may be adjusted to alter the amount of power supplied to the component. As a particular example, the duty cycle of the signal may be decreased as power in the component approaches an upper threshold, which may help to prevent overheating or damage. In many conventional systems, microcontrollers are responsible for controlling the amount of power delivered to one or more external components.

SUMMARY

This disclosure provides a semiconductor device having an integrated, self-regulated pulse width modulation current and power limiter and method.

In a first embodiment, a method includes receiving an activation signal at a semiconductor device and generating an output power signal at the semiconductor device in response to receiving the activation signal. The output power signal has a duty cycle. The method also includes providing the output power signal to a load. The output power signal provides power to the load. An amount of power provided to the load is based on the duty cycle of the output power signal. In addition, the method includes adjusting the duty cycle of the output power signal using at least one of a current limiter and a power limiter integrated in the semiconductor device.

In a second embodiment, a semiconductor device includes an output power signal generator capable of generating an output power signal. The output power signal has a duty cycle and provides power to a load. An amount of power provided to the load is based on the duty cycle of the output power signal. The semiconductor device also includes a controller capable of causing the output power signal generator to generate the output power signal in response to receiving an activation signal. The semiconductor device further includes at least one of a current limiter and a power limiter capable of adjusting the duty cycle of the output power signal.

In a third embodiment, a system includes a power supply capable of providing a supply voltage and a semiconductor device. The semiconductor device is capable of generating an output power signal using the supply voltage in response to an activation signal. The output power signal has a duty cycle. The semiconductor device is also capable of providing the output power signal to a load. An amount of power provided to the load is based on the duty cycle of the output power signal. In addition, the semiconductor device is capable of adjusting the duty cycle of the output power signal using at least one of a current limiter and a power limiter integrated in the semiconductor device.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
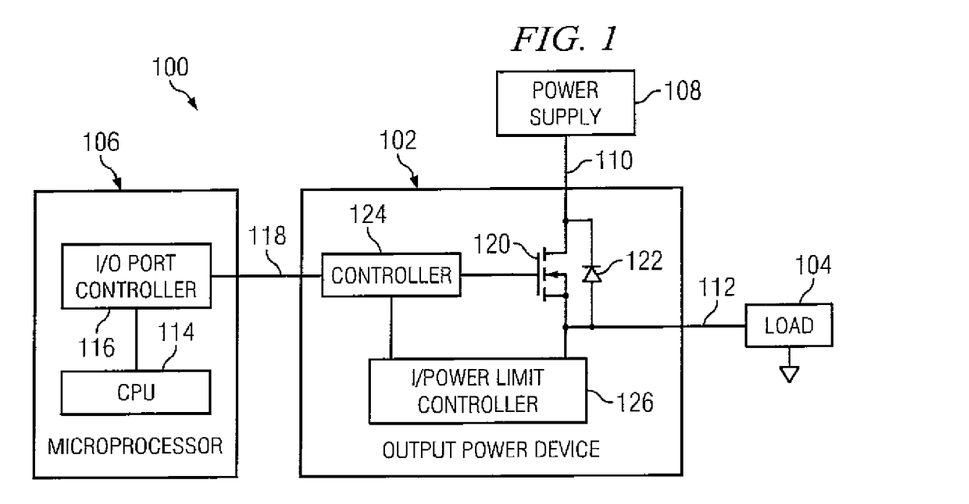
FIG. 1 illustrates an example system including a semiconductor device having an integrated pulse width modulation ("PWM") current and power limiter according to one embodiment of this disclosure.

FIG. 1 illustrates an example system 100 including a semiconductor device having an integrated pulse width modulation ("PWM") current and power limiter according to one embodiment of this disclosure. The embodiment of the system 100 shown in FIG. 1 is for illustration only. Other embodiments of the system 100 may be used without departing from the scope of this disclosure.

Figure 2:
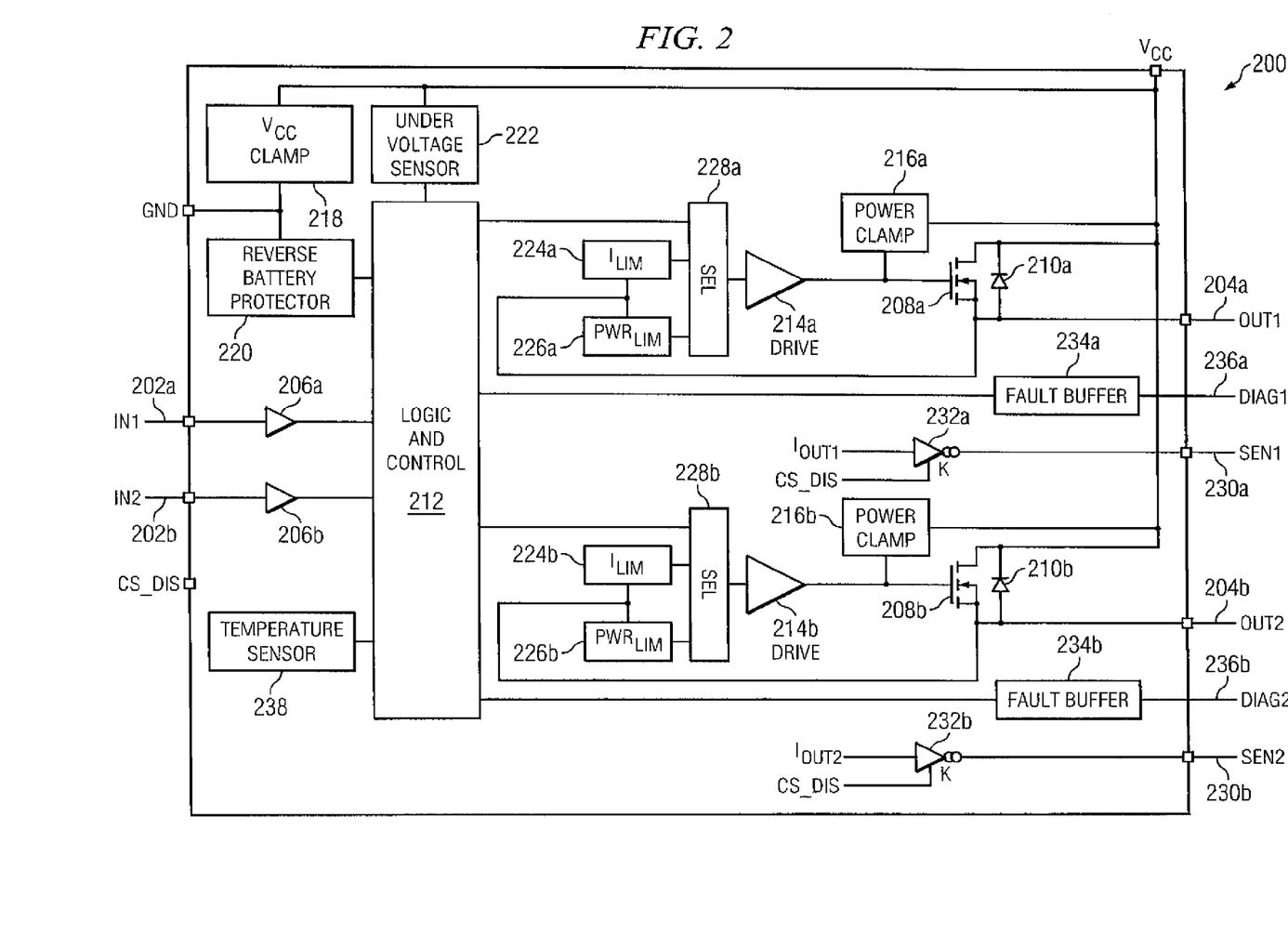
FIG. 2 illustrates an example semiconductor device having an integrated PWM current and power limiter according to one embodiment of this disclosure.

In the illustrated embodiment, the system 100 includes an output power device 102, a load 104, a microcontroller 106, and a power supply 108. The output power device 102 is coupled to the load 104 and to the power supply 108. In this document, the term "couple" and its derivatives refer to any direct or indirect communication between two or more elements, whether or not those elements are in physical contact with one another. The output power device 102 receives a voltage signal 110 from the power supply 108. The output power device 102 converts the voltage signal 110 into a power signal 112, and the power signal 112 is provided to the load 104 and supplies power to the load 104. The output power device 102 includes any hardware, software, firmware, or combination thereof for supplying power to one or more loads 104. One embodiment of the output power device 102 is shown in FIG. 2, which is described below. The power supply 108 includes any voltage source or sources for the output power device 102, such as one or more batteries or other voltage sources.

The load 104 is coupled to the output power device 102. The load 104 represents any suitable device or component capable of performing any of a wide variety of functions using the power supplied by the power signal 112. For example, the load 104 could represent a lamp, motor, or solenoid in a motor vehicle. As particular examples, the load 104 could represent a lamp in the dashboard of a vehicle, a motor capable of opening and closing a window or locking and unlocking a door in the vehicle, or a solenoid capable of unlocking a trunk door in the vehicle. As other particular examples, the load 104 could represent any resistive or inductive load, such as a load directly coupled to ground or indirectly coupled to ground by a switching device. The load 104 could represent any other or additional device or component capable of performing any other or additional function in the system 100.

The microcontroller 106 is coupled to the output power device 102. The microcontroller 106 controls the providing of power to the load 104 by the output power device 102. For example, the microcontroller 106 could generate a signal 118 that causes the output power device 102 to begin providing the power signal 112 to the load 104. The microcontroller 106 could also generate a signal 118 that causes the output power device 102 to stop providing the power signal 112 to the load 104. In this example, the microcontroller 106 is coupled to the output power device 102 by a single connection, which is used to provide the control signals 118 to the output power device 102. In other embodiments, the microcontroller 106 could be coupled to the output power device 102 by multiple connections. The microcontroller 106 includes any hardware, software, firmware, or combination thereof for controlling the output power device 102. While FIG. 1 illustrates the microcontroller 106 generating the control signals 118, the control signals 118 could also be provided by other logic devices (such as a signal transistor), represent mechanically switched signals, or be provided by any other or additional source.

In this example, the microcontroller 106 includes a central processing unit ("CPU") 114 and an input/output ("I/O") port controller 116. The CPU 114 is responsible for executing instructions and processing data to determine how to control the output power device 102. The CPU 114 may also generate the control signals 118 used to control the output power device 102. The CPU 114 represents any suitable processing device or devices. The I/O port controller 116 is capable of providing access to one or more I/O ports. At least one of the I/O ports is capable of facilitating the communication of the control signals 118 to the output power device 102.

While FIG. 1 illustrates a single output power device 102 providing power to a single load 104, the system 100 could include any number of output power devices 102 providing power to any number of loads 104. For example, in a vehicle, a number of output power devices 102 could be used to provide power to a number of lamps, motors, solenoids, and/or other or additional loads 104. Also, each output power device 102 could provide power to one or multiple loads 104. In these embodiments, the microcontroller 106 may generate signals 118 to control each of the output power devices 102.

In conventional systems, a microcontroller implemented a pulse width modulation technique to control the amount of power supplied by one or more external components. The microcontroller also limited the amount of current supplied by the one or more external components. A problem in the conventional systems is that the microcontroller often needed to provide over-current protection and active current and power limiting and monitoring for each external component. This often required that the microcontroller have multiple dedicated inputs and outputs (such as I/O ports) for monitoring and controlling each external component. As a particular example, this may have required the microcontroller to use three dedicated I/O ports (two inputs and one output) for monitoring and controlling each external component. As a result, if N external components were controlled, the microcontroller may have required 3×N dedicated I/O ports. This typically increased the size and cost of the microcontroller. Also, the software overhead required in the microcontroller to monitor the external components was often substantial. In addition, the microcontroller often could not directly measure the temperature of the external components, which may increase the likelihood that the external components will suffer from thermal stresses (such as overheating, damage, or other thermal incident).

In the example embodiment shown in FIG. 1, the output power device 102 includes a switching transistor 120 and a diode 122. The switching transistor 120 is coupled to the power supply 108 and the load 104. The switching transistor 120 is capable of selectively operating in conductive and non-conductive states, which couple and decouple the power supply 108 and the load 104. This allows power for the load 104 to be switched on and off, giving the power signal 112 a duty cycle defined by the length of time the switching transistor 120 is switched on and off. The switching transistor 120 includes any suitable transistor or combination of transistors. For example, the switching transistor 120 could represent an n-channel Metal-Oxide Semiconductor Field Effect Transistor ("MOSFET") having a gate, a drain coupled to the power supply 108, and a source coupled to the load 104. The diode 122 helps to reduce or prevent inappropriate current flow between the source and drain of the switching transistor 120. The diode 122 represents any suitable type of diode and number of diodes.

In this embodiment, the output power device 102 also includes a controller 124 and a current/power limit controller 126. The controller 124 is coupled to the gate of the switching transistor 120. Because the controller 124 is coupled to the gate of the switching transistor 120, the controller 124 is capable of controlling the switching of the transistor 120. For example, when a control signal 118 activating the output power device 102 is received, the controller 124 may place the switching transistor 120 into conducting and non-conducting states as needed to provide a power signal 112 with a suitable duty cycle to the load 104. When a control signal 118 deactivating the output power device 102 is received, the controller 124 may place the switching transistor 120 into the non-conducting state, and power is no longer provided to the load 104. The controller 124 includes any hardware, software, firmware, or combination thereof for controlling the switching transistor 120.

The current/power limit controller 126 implements a pulse width modulation technique to control the amount of power and/or current provided to the load 104. For example, the controller 124 places the switching transistor 120 into the conducting and non-conducting states, producing a power signal 112 having a specific duty cycle. The current/power limit controller 126 may control the controller 124 so that the power signal 112 has an appropriate duty cycle. The current/power limit controller 126 may also cause the controller 124 to change the duty cycle of the power signal 112 as needed.

The current/power limit controller 126 also provides various forms of protection for the output power device 102. For example, the current/power limit controller 126 may determine that a reference temperature measurement of the output power device 102 is approaching a critical level, and the current/power limit controller 126 may cause the output power device 102 to enter a self-limiting mode. The reference temperature measurement could represent a single temperature gradient or multiple temperature gradients measured within the output power device 102 and may also be based on temperature gradients as a function of calculated time periods. In the self-limiting mode, the output power device 102 allows the load 104 to pull a reduced amount of current or power from the output power device 102. The current/power limit controller 126 could also ensure that an excessive amount of current and/or power is not supplied to the load 104. Because of this, the current/power limit controller 126 implements a current and/or power limiter function in the system 100. The current/power limit controller 126 includes any hardware, software, firmware, or combination thereof for limiting the current and/or power provided to one or more loads 104.

In this example embodiment, the current/power limit controller 126 implements a pulse width modulation technique to control the power signal 112 provided to the load 104. Depending on the implementation, this may provide several benefits in the system 100. For example, the microcontroller 106 may, but need not, receive various inputs to control the output power device 102. Because the microcontroller 106 is not required to receive the inputs, this may help to reduce the number of I/O ports needed in the microcontroller 106. This may also allow cheaper or smaller microcontrollers to be used in the system 100. Further, the output power device 102 could be used in stand-alone applications where no supervision (microcontroller 106) is required, and the output power device 102 could still protect itself and other components in the system 100 from various problems. In addition, the output power device 102 could operate based on actual temperature measurements of the output power device 102. This may allow the output power device 102 to enter a self-limiting mode to control its temperature with less delay. This may also help to reduce or avoid the output power device 102 performing a thermal shutdown when its temperature reaches a critical level or suffering from thermal stresses or permanent damage.

Although FIG. 1 illustrates one example of a system 100 including a semiconductor device (output power device 102) having an integrated PWM current and power limiter, various changes may be made to FIG. 1. For example, the functional division of the components shown in FIG. 1 is for illustration only. Various components shown in FIG. 1 could be combined or omitted and additional components could be added according to particular needs. As a specific example, while shown separately in FIG. 1, the controller 124 and the current/power limit controller 126 could be combined into a single functional unit. Also, any number of output power devices 102 could be used in the system 100 and controlled by the microcontroller 106, and each output power device 102 could be coupled to any number of loads 104. Further, the current/power limit controller 126 could provide a current limiting function, a power limiting function, or both functions in the output power device 102. In addition, FIG. 1 illustrates one example operational environment of the output power device 102. The output power device 102 could be used in any other suitable environment.

FIG. 2 illustrates an example semiconductor device 200 having an integrated PWM current and power limiter according to one embodiment of this disclosure. The semiconductor device 200 could, for example, represent the output power device 102 shown in FIG. 1. The embodiment of the semiconductor device 200 shown in FIG. 2 is for illustration only. Other embodiments of the semiconductor device 200 may be used without departing from the scope of this disclosure.

In the illustrated embodiment, the semiconductor device 200 receives two input signals 202a-202b at pins IN1 and IN2. The semiconductor device 200 produces two output power signals 204a-204b at pins OUT1 and OUT2. The output power signals 204a-204b provide power to one or more loads, such as load 104 of FIG. 1, coupled to the semiconductor device 200. The input signals 202a-202b control whether the semiconductor device 200 produces the output power signals 204a-204b. For example, when the input signal 202a is enabled, an output power signal 204a at pin OUT1 may be produced. Similarly, when the input signal 202b is enabled, an output power signal 204b at pin OUT2 may be produced. The input signals 202a-202b could, for example, represent control signals 118 from the microcontroller 106 of FIG. 1. In this example, the input signals 202a-202b pass through two buffers 206a-206b, which could represent any suitable buffers.

The semiconductor device 200 includes two switching transistors 208a-208b and two diodes 210a-210b. The switching transistors 208a-208b are capable of receiving a supply voltage provided at pin $V_{CC}$. The supply voltage could, for example, represent the voltage signal 110 from the power supply 108 of FIG. 1. The switching transistors 208a-208b are also capable of generating the output power signals 204a-204b. For example, each of the switching transistors 208a-208b may be selectively placed in conducting and non-conducting states to generate an output signal having a suitable duty cycle. The diodes 210a-210b reduce or prevent inappropriate current flow between the sources and drains of the switching transistors 208a-208b. Each of the transistors 208a-208b may represent any suitable transistor or combination of transistors, such as an n-channel MOSFET. Each of the diodes 210a-210b may represent any suitable type of diode and number of diodes.

A logic and control unit 212 controls the operation of the semiconductor device 200. For example, the logic and control unit 212 may be coupled to gates of the switching transistors 208a-208b through two drivers 214a-214b. The logic and control unit 212 may provide signals to the transistors 208a-208b through the drivers 214a-214b to place each of the transistors 208a-208b in the conducting and non-conducting states as needed. In this way, the logic and control unit 212 causes the transistors 208a-208b to produce the output power signals 204a-204b having appropriate duty cycles. The drivers 214a-214b receive the signals generated by the logic and control unit 212 and provide control signals to the gates of the transistors 208a-208b. The logic and control unit 212 includes any hardware, software, firmware, or combination thereof for controlling the operation of the semiconductor device 200. The logic and control unit 212 could, for example, represent the controller 124 of FIG. 1. The drivers 214a-214b represent any hardware, software, firmware, or combination thereof for driving control signals used to control the transistors 208a-208b, such as charge pumps.

To protect the transistors 208a-208b, the semiconductor device 100 includes two power clamps 216a-216b. The power clamps 216a-216b are coupled to the drivers 214a-214b, the pin $V_{CC}$, and the gates and drains of the transistors 208a-208b. The power clamps 216a-216b ensure that the transistors 208a-208b are not driven by an excessive amount, which could damage the transistors 208a-208b. Each of the power clamps 216a-216b represents any hardware, software, firmware, or combination thereof for limiting the power of a signal.

Other components are also used to protect the semiconductor device 200. For example, an input voltage clamp 218 may provide a restoring current whenever the supply voltage at pin $V_{CC}$ varies from an expected or desired voltage. A reverse battery protector 220 may help to reduce or prevent damage to the semiconductor device 200 caused by reverse installation of a battery or other power source supplying the voltage at pin $V_{CC}$, accidental short circuiting, or other inappropriate operation. An under-voltage protector 222 may help to reduce or prevent damage to the semiconductor device 200 caused by a supply voltage at pin $V_{CC}$ that fails to meet a minimum threshold voltage.

PWM current and power limiting in the semiconductor device 200 are provided by two current limiters 224a-224b, two power limiters 226a-226b, and two selectors 228a-228b. The current limiters 224a-224b are coupled to the sources of the transistors 208a-208b. The current limiters 224a-224b monitor the amount of current provided by the output power signals 204a-204b. The current limiters 224a-224b ensure that the current of each of the output power signals 204a-204b does not exceed a threshold current level. For example, the current limiters 224a-224b may generate signals that cause the drivers 214a-214b to reduce the duty cycle of one or both of the output power signals 204a-204b to adjust the current provided by the output power signals 204a-204b as needed. This may help to protect the semiconductor device 200 against various problems, such as short circuits (including shorts directly to ground or a voltage source, and unexpected or abnormal low resistive connections to ground or a voltage source), transients resulting from electrical load dumps, or high power operation under normal conditions. Each of the current limiters 224a-224b represents any hardware, software, firmware, or combination thereof for limiting the current in a signal.

The power limiters 226a-226b are coupled to the sources of the transistors 208a-208b. The power limiters 226a-226b monitor the amount of power provided by the output power signals 204a-204b. The power limiters 226a-226b ensure that the power of each of the output power signals 204a-204b does not exceed a threshold power level, such as 30 W. For example, the power limiters 226a-226b may generate signals that cause the drivers 214a-214b to reduce the duty cycle of one or both of the output power signals 204a-204b to adjust the power provided by the output power signals 204a-204b as needed. Each of the power limiters 226a-226b represents any hardware, software, firmware, or combination thereof for limiting the power in a signal. The current limiters 224a-224b and the power limiters 226a-226b could, for example, represent the current/power limit controller 126 of FIG. 1.

The selectors 228a-228b select which signal is provided to the drivers 214a-214b for driving the transistors 208a-208b. For example, under normal operation, the selectors 228a-228b may output the signals provided by the logic and control unit 212. If a current limiter detects that an output power signal is providing excessive current, the appropriate selector could output the signal provided by the current limiter. Similarly, if a power limiter detects that an output power signal is providing excessive power, the appropriate selector could output the signal provided by the power limiter. The signal provided by the current limiter and power limiter could prevent a load 104 from drawing an excessive current or excessive power from the semiconductor device 200. The selectors 228a-228b could be controlled in any suitable manner, such as when control signals from the logic and control unit 212 control that is outputted by the selectors 228a-228b. Each of the selectors 228a-228b includes any hardware, software, firmware, or combination thereof for selecting and outputting a signal, such as a multiplexer.

As shown in FIG. 2, the semiconductor device 200 produces two other output signals, referred to as current sense output signals 230a-230b, at pins SEN1 and SEN2. The current sense output signals 230a-230b are proportional to the output power signals 204a-204b provided at pins OUT1 and OUT2. The current sense output signals 230a-230b are produced by two tri-state buffers 232a-232b. The tri-state buffers 232a-232b receive two signals $I_{OUT1}$ and $I_{OUT2}$. The signals $I_{OUT1}$ and $I_{OUT2}$ may represent signals having currents that are equal to the currents of the output power signals 204a-204b, respectively. The tri-state buffers 232a-232b also factor the signals $I_{OUT1}$ and $I_{OUT2}$ by a value of K and provide the factored signals as the current sense output signals 230a-230b. In this way, the tri-state buffers 232a-232b produce current sense output signals 230a-230b that are proportional to the output power signals 204a-204b. The tri-state buffers 232a-232b represent any suitable buffers.

The tri-state buffers 232a-232b are controlled by a control signal received at pin CS_DIS, which determines whether or not the tri-state buffers 232a-232b output the factored signals $I_{OUT1}$ and $I_{OUT2}$. For example, the control signal received at pin CS_DIS may have a low logic level during normal operation, allowing the tri-state buffers 232a-232b to output the factored signals $I_{OUT1}$ and $I_{OUT2}$ as the current sense output signals 230a-230b. When a fault is detected, the fault could be indicated by one or more output pins (as described below), and the tri-state buffers 232a-232b could be placed in a tri-state condition.

The semiconductor device 200 further includes two fault storage buffers 234a-234b, which are used to produce two additional output signals (referred to as diagnostic output signals 236a-236b) at pins DIAG1 and DIAG2. The fault storage buffers 234a-234b store information identifying a fault in the semiconductor device 200. For example, when one or more faults are detected in the semiconductor device 200 (such as excessive temperature), the logic and control unit 212 could generate one or more fault conditions identifying the fault (s). The fault storage buffers 234a-234b store the fault conditions produced by the logic and control unit 212. A detected fault condition could then be provided through the pins DIAG1 and DIAG2 using, for example, a simple analog, digital, or serial digital format. The fault storage buffers 234a-234b represent any structure or structures capable of storing information. Also, in other embodiments, the fault conditions stored in the fault storage buffers 234a-234b could be provided through the SEN1 and SEN2 pins.

In addition, the semiconductor device 200 includes one or more temperature sensors 238. The temperature sensors 238 measure temperatures or temperature gradients as a function of time and provide reference temperature measurements to the logic and control unit 212. If a reference temperature measurement exceeds a threshold, the logic and control unit 212 could take any appropriate action, such as entering a self-limiting mode. A reference temperature measurement could indicate a calculated temperature rise over a short time period that would allow the power limiters 226a-226b to alter the duty cycle of one or both output signals 204a-204b, allowing operation at reduced levels during fast transients or inrush conditions. Each temperature sensor 238 represents any structure capable of measuring a temperature.

In this example embodiment, the semiconductor device 200 implements a PWM control scheme using the current limiters 224a-224b and the power limiters 226a-226b. Because the PWM control scheme is implemented in the semiconductor device 200 rather than an external component such as a microcontroller, the number of inputs required by the microcontroller may be reduced. This may help to reduce the size and cost of the microcontroller. Also, the semiconductor device 200 could be used in stand-alone applications where no microcontroller is provided. In the stand-alone applications, the input pins IN1 and/or IN2 could be tied directly to a logic value that activates the semiconductor device 200. Further, the semiconductor device 200 could protect itself against various problems, such as under-voltage conditions or excessive temperatures. In addition, the semiconductor device 200 may operate using the actual temperature of the semiconductor device 200, which may help to reduce or avoid thermal stresses in the semiconductor device 200.

Although FIG. 2 illustrates one example of a semiconductor device 200 having an integrated PWM current and power limiter, various changes may be made to FIG. 2. For example, the semiconductor device 200 could include any other or additional I/O pins supporting any other functions in the semiconductor device 200. Also, the semiconductor device 200 could generate any suitable number of output power signals, including one signal or more than two signals. In addition, the semiconductor device 200 could include a power limiter, a current limiter, or both limiters for each output power signal generated.

Figure 3A:
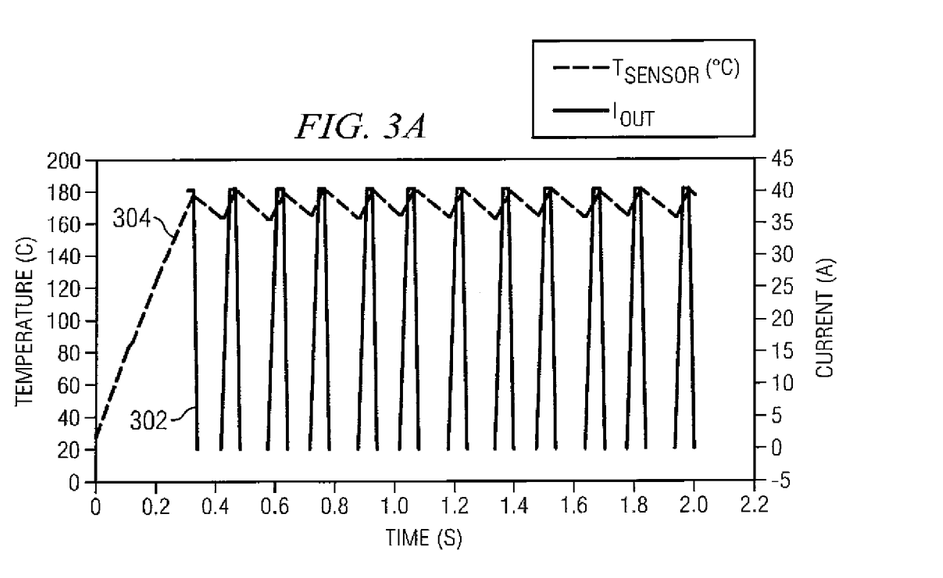
FIGS. 3A through 3C illustrate operation of a semiconductor device with and without an integrated PWM current and power limiter according to one embodiment of this disclosure.
Figure 3B:
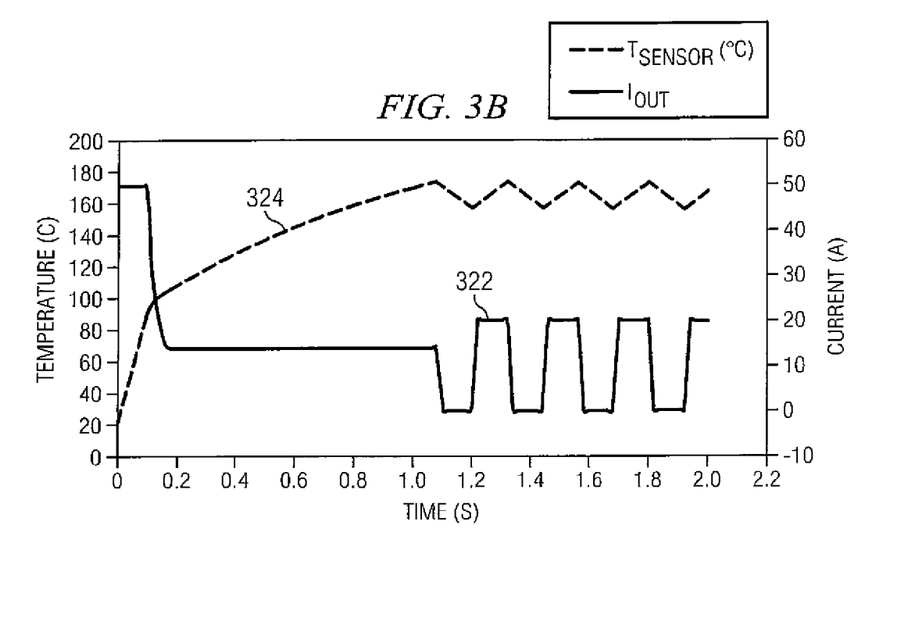
Figure 3C:
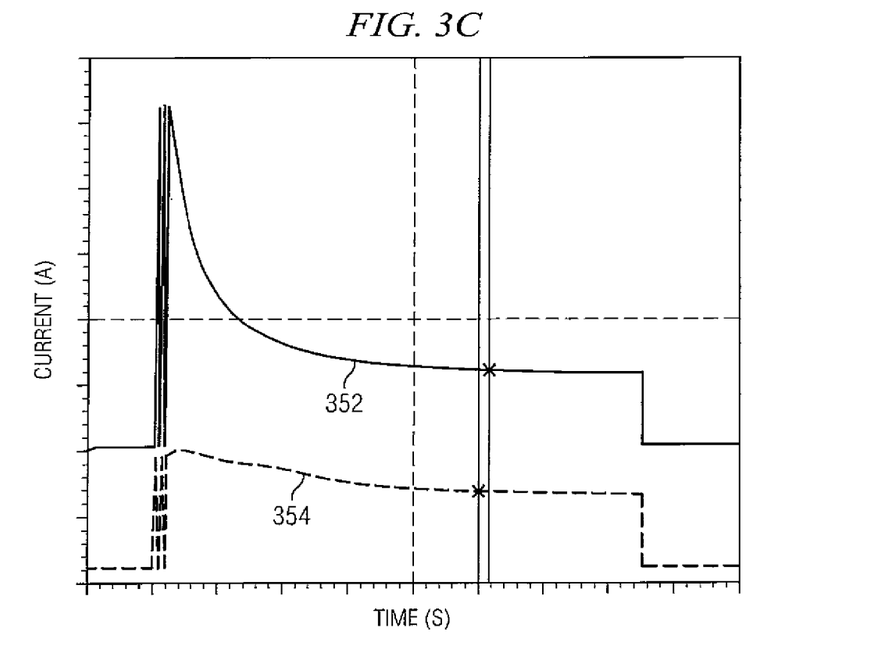

FIGS. 3A through 3C illustrate operation of a semiconductor device with and without an integrated PWM current and power limiter according to one embodiment of this disclosure. In particular, FIGS. 3A and 3B illustrate how the temperature of a semiconductor device and the current level of an output power signal generated by the semiconductor device may vary over time, while FIG. 3C illustrates how an output power signal and a current sense output signal vary over time. The operations illustrated in FIGS. 3A through 3C are for illustration only. Other embodiments of the semiconductor device that operate in other ways may be used without departing from the scope of this disclosure.

FIG. 3A illustrates the operation of a semiconductor device during a permanent overload or short circuit condition without an integrated PWM current and power limiter. In FIG. 3A, line 302 represents the current of the output power signal produced by the semiconductor device, and line 304 represents the temperature of the semiconductor device.

As shown in FIG. 3A, the semiconductor device is suffering from a passive short circuit condition. The current (represented by line 302) of the output power signal rapidly oscillates between approximately 0 A and approximately 40 A. The temperature (represented by line 304) of the semiconductor device increases rapidly from approximately 20° C. to approximately 180° C. The temperature then oscillates between approximately 180° C. and approximately 160° C. When the current is at or near 0 A, the temperature falls gradually. When the current is at or near 40 A, the temperature increases rapidly. The rapid initial increase in temperature and the rapid oscillations in temperature place thermal stress on the semiconductor device, which may damage and shorten the life of the semiconductor device. In a conventional device, the device would turn off in an over-temperature condition (despite its input) and turn back on when it cools to a lower temperature based on an over-temperature hysteresis limit.

FIG. 3B illustrates the operation of a semiconductor device with an integrated PWM current and power limiter, such as the semiconductor device 200 of FIG. 2. In FIG. 3B, line 322 represents the current of the output power signal (such as signal 204a) produced by the semiconductor device 200, and line 324 represents the temperature of the semiconductor device 200.

As shown in FIG. 3B, the semiconductor device 200 is suffering from a passive short circuit condition. In this example, the current (represented by line 322) of the output power signal 204a oscillates between approximately 0 A and approximately 20 A. Also, the temperature (represented by line 324) of the semiconductor device 200 increases from approximately 20° C. to approximately 180° C., and the temperature then oscillates between approximately 180° C. and approximately 160° C. However, the current oscillates more gradually in FIG. 3B than in FIG. 3A. As a result, less current is pulled from the semiconductor device 200 during the passive short condition. Also, the oscillations in current and temperature occur more slowly. In addition, the oscillation in current occurs later in FIG. 3B than in FIG. 3A, and the temperature increases more slowly during this initial period.

Because the semiconductor device 200 includes an integrated PWM control scheme, the semiconductor device 200 experiences less thermal stress. The temperature rises more slowly at the start of the short condition and oscillates slower during the short condition. Also, the current oscillates slower and reaches a lower level. This helps to reduce the stress placed on the semiconductor device 200, which may also help to increase the life of the semiconductor device 200.

FIG. 3C illustrates the operation of a semiconductor device during an in-rush or fast transient condition with an integrated PWM current and power limiter, such as the semiconductor device 200 of FIG. 2. In FIG. 3C, line 352 represents the current of the output power signal (such as signal 204a) produced by the semiconductor device 200, and line 354 represents the current of a current sense output signal (such as signal 230a) produced by the semiconductor device 200. As shown in FIG. 3C, the current sense output signal generally follows the output power signal. As shown in FIG. 3C, the semiconductor device 200 returns to normal operation after the in-rush or fast transient condition has ended.

Although FIGS. 3A through 3C illustrate example operation of a semiconductor device with and without an integrated PWM current and power limiter, various changes may be made to FIGS. 3A through 3C. For example, the semiconductor device associated with FIG. 3A and the semiconductor device 200 associated with FIGS. 3B and 3C could operate in any other suitable manner. FIGS. 3A through 3C are provided only as an illustration of possible operation of semiconductor devices with and without an integrated PWM current and power limiter. Further, the temperature and current values and times indicated in FIGS. 3A through 3C are only references, and their actual values may be determined by the final device design parameters.

Figure 4:
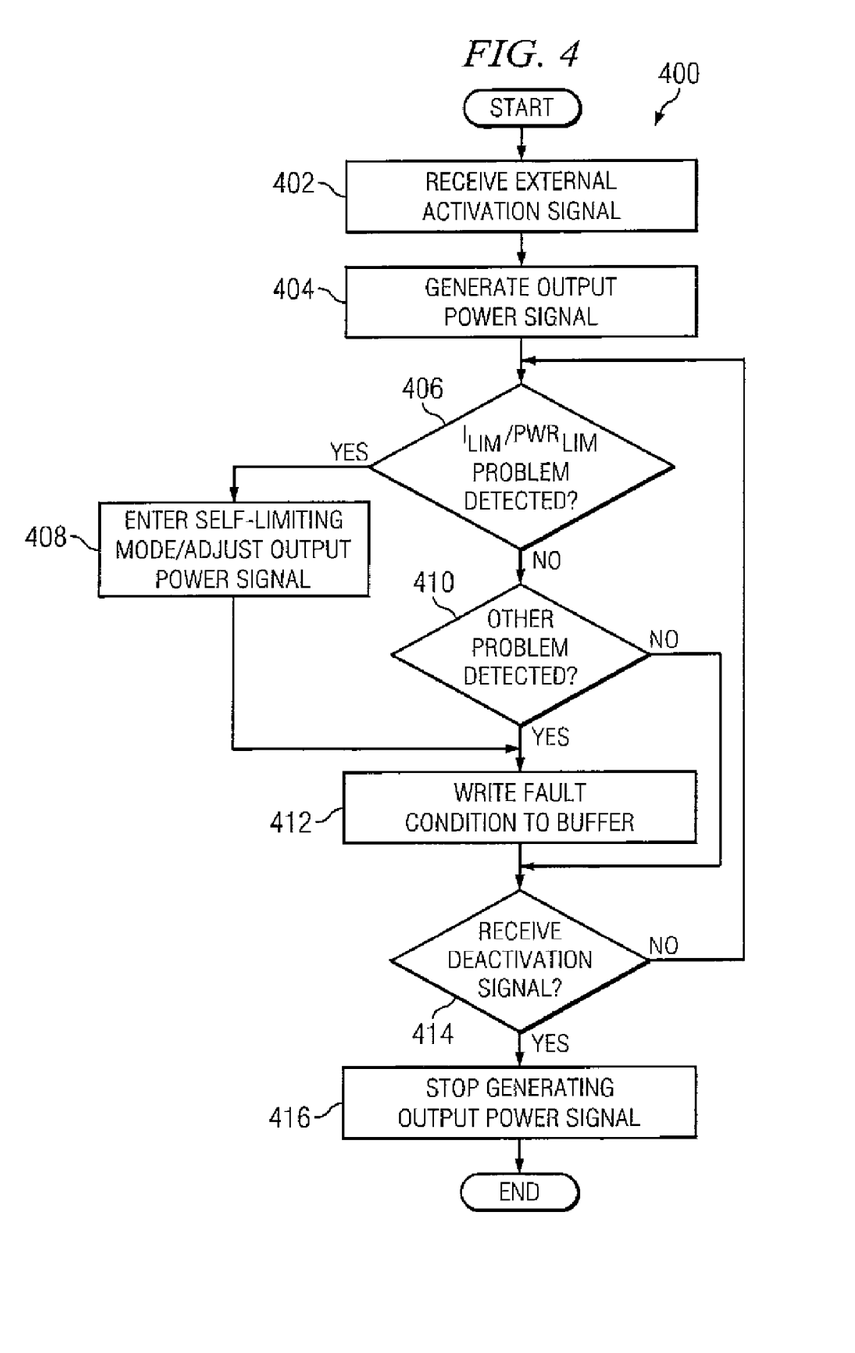
FIG. 4 illustrates an example method for PWM current and power limiting in a semiconductor device according to one embodiment of this disclosure.

FIG. 4 illustrates an example method 400 for PWM current and power limiting in a semiconductor device according to one embodiment of this disclosure. For ease of explanation, the method 400 is described with respect to the semiconductor device 200 of FIG. 2 operating as the output power device 102 in FIG. 1. The method 400 could be used by any other device and in any other system without departing from the scope of this disclosure.

The semiconductor device 200 receives an activation signal from an external source at step 402. This may include, for example, the semiconductor device 200 receiving a control signal 118 having a high logic level from a microcontroller 118 as an input signal 202a.

The semiconductor device 200 generates an output power signal at step 404. This may include, for example, the logic and control unit 212 in the semiconductor device 200 detecting the input signal 202a. This may also include the logic and control unit 212 causing the driver 214a to drive the transistor 208a into conducting and non-conducting states to generate an output power signal 204a having an appropriate duty cycle. This may further include providing the output power signal 204a to a load, such as a load 104.

The semiconductor device 200 determines whether any current limiting or power limiting problems with the semiconductor device 200 are detected at step 406. This may include, for example, the current limiter 224a and/or the power limiter 226a determining whether too much current or power is being provided by the output power signal 204a.

This may also include the logic and control unit 212 detecting a temperature above a threshold from the temperature sensor 238.

If any current limiting or power limiting problems are detected, the semiconductor device 200 enters a self-limiting mode and/or adjusts the output power signal at step 408. This may include, for example, the logic and control unit 212, current limiter 224a, or power limiter 226a controlling the transistor 208a so that only a limited amount of current and power may be drawn from the semiconductor device 200. This may also include the current limiter 224a or the power limiter 226a adjusting the duty cycle of the output power signal 204a. The semiconductor device 200 could remain in the self-limiting mode for any specified period of time, such as during the time that the fault is detected or until a reset occurs.

If no current limiting or power limiting problems are detected at step 406, the semiconductor device 200 determines whether any other problems are detected at step 410. This may include, for example, the logic and control unit 212 receiving an indication of an under-voltage condition from the under-voltage sensor 222.

After step 408 or if another problem is detected at step 410, the semiconductor device 200 writes a fault condition identifying the detected problem at step 412. This may include, for example, the logic and control unit 212 writing the fault condition to the fault storage buffer 234a.

The semiconductor device 200 determines whether a deactivation signal from an external source is received at step 414. This may include, for example, the semiconductor device 200 receiving a control signal 118 having a low logic level from the microcontroller 118 as an input signal 202a.

If no deactivation signal is detected, the semiconductor device 200 returns to step 406. Otherwise, the semiconductor device 200 stops generating the output power signal at step 416. This may include, for example, the logic and control unit 212 in the semiconductor device 200 detecting the input signal 202a. This may also include the logic and control unit 212 causing the driver 214a to drive the transistor 208a into the non-conducting state. At this point, no more power is provided to the load 104 coupled to the semiconductor device 200.

Although FIG. 4 illustrates one example of a method 400 for PWM current and power limiting in a semiconductor device, various changes may be made to FIG. 4. For example, while FIG. 4 illustrates a series of steps, various steps may occur in parallel. For example, the semiconductor device 200 could generate the output power signal at step 404 and determine whether problems are detected at step 408 in parallel. Also, while the activation and deactivation signals are shown as originating at a microcontroller, the activation signal and/or deactivation signal could originate from other sources. As an example, the IN1 pin of the semiconductor device 200 could be tied to a logic level that activates the semiconductor device 200. In this case, the semiconductor device 200 still receives an activation signal, and the signal remains constant as long as power is supplied to the system 100. In addition, in other embodiments, the semiconductor device 200 may support only one of power limiting and current limiting.

It may be advantageous to set forth definitions of certain words and phrases used in this patent document. The terms "include" and "comprise," as well as derivatives thereof, mean inclusion without limitation. The term "or" is inclusive, meaning and/or. The term "each" refers to every of at least a subset of the identified items. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The terms "controller" and "microcontroller" mean any device, system, or part thereof that controls at least one operation. A controller or microcontroller may be implemented in hardware, firmware, or software, or a combination of at least two of the same. It should be noted that the functionality associated with any particular controller or microcontroller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method, comprising:
   receiving an external activation signal at a semiconductor device;
   generating an output power signal at the semiconductor device in response to receiving the activation signal, the output power signal having a duty cycle;
   providing the output power signal to an external load, the output power signal providing power to the load, an amount of power provided to the load based on the duty cycle of the output power signal; and
   detecting a problem in the semiconductor device based on a measurement of temperature in the semiconductor device; and
   in response to detecting the problem, placing the semiconductor device in a self-limiting mode in which at least one of a reduced amount of current and a reduced amount of power is provided to the load.

2. The method of claim 1, wherein placing the semiconductor device in a self-limiting mode further comprises:
   adjusting the duty cycle of the output power signal using at least one of a current limiter and a power limiter integrated in the semiconductor device.

3. The method of claim 1, wherein detecting a problem in the semiconductor device based on measuring temperature in the semiconductor device comprises:
   measuring one or more temperatures within the semiconductor device; and
   comparing at least one of (1) the one or more measured temperatures and (ii) one or more calculated temperature rise times and gradients to one or more thresholds.

4. The method of claim 1, wherein placing the semiconductor device in the self-limiting mode reduces thermal stresses in the semiconductor device.

5. The method of claim 1, wherein placing the semiconductor device in the self-limiting mode controls temperature of the semiconductor device to avoid thermal shutdown.

6. The method of claim 1, further comprising:
   storing information identifying the detected problem in a fault storage buffer.

7. The method of claim 1, wherein generating the output power signal comprises driving a transistor coupled between a power supply and the load into conducting and non-conducting states to produce the output power signal.

8. The method of claim 1, wherein the semiconductor device performs the receiving, generating, providing, detecting and placing steps in a stand-alone mode without any external controller.

9. The method of claim 1, wherein the load comprises one or more of: a motor, a solenoid, and a lamp in a vehicle.

10. A semiconductor device for use with an external power supply, an external load and an external activation signal, the semiconductor device comprising:

an output power signal generator capable of generating an output power signal, the output power signal having a duty cycle and providing power to the load, an amount of power provided to the load based on the duty cycle of the output power signal;

a temperature sensor for measuring temperature within the semiconductor device:

a controller capable of causing the output power signal generator to generate the output power signal in response to receiving the activation signal and placing the semiconductor device in a self-limiting mode in which at least one of a reduced amount of current or a reduced amount of power is provided to the load when a measured temperature exceeds a threshold.

11. The semiconductor device of claim 10, wherein the controller is capable of adjusting the duty cycle of the output power signal to reduce thermal stresses in the semiconductor device.

12. The semiconductor device of claim 10, wherein the controller is capable of adjusting the duty cycle of the output power signal to control temperature of the semiconductor device to avoid thermal shutdown.

13. The semiconductor device of claim 10, wherein the output power signal generator comprises a switching transistor coupled between the power supply and the load; and further comprising a driver capable of driving the transistor into conducting and non-conducting states to produce the output power signal, the driver capable of being controlled by the controller.

14. The semiconductor device of claim 10, further comprising:

a fault storage buffer capable of storing a fault condition identifying a temperature problem in the semiconductor device.

15. The semiconductor device of claim 10, wherein the controller is capable of adjusting the duty cycle of the output power signal when a measured temperature gradient exceeds a threshold.

16. A system, comprising:

a power supply capable of providing a supply voltage; and
a semiconductor device capable of:

generating an output power signal using the supply voltage in response to receipt of an external activation signal, the output power signal having a duty cycle;

providing the output power signal to an external load, an amount of power provided to the load based on the duty cycle of the output power signal;

detecting a problem in the semiconductor device based on a measurement of temperature in the semiconductor device; and in response to detecting the problem, placing the semiconductor device in a self-limiting mode in which at least one of a reduced amount of current and a reduced amount of power is provided to the load.

17. The system of claim 16, further comprising:
a controller is capable of adjusting the duty cycle of the output power signal to reduce thermal stresses in the semiconductor device.

18. The system of claim 16, further comprising:
a controller is capable of adjusting the duty cycle of the output power signal to control temperature of the semiconductor device to avoid thermal shutdown.

19. The system of claim 16, further comprising:
a controller; and
an output power signal generator including a switching transistor coupled between the power supply and the load and a driver capable of driving the transistor into conducting and non-conducting states to produce the output power signal, the driver capable of being controlled by the controller.

20. The system of claim 16, further comprising:
a fault storage buffer capable of storing a fault condition identifying a temperature problem in the semiconductor device.

* * * * *